US009329785B2

(12) United States Patent
Liang et al.

(10) Patent No.: US 9,329,785 B2
(45) Date of Patent: May 3, 2016

(54) METHOD OF INTERLEAVING, DE-INTERLEAVING, AND CORRESPONDING INTERLEAVER AND DE-INTERLEAVER

(71) Applicant: Montage Technology (Shanghai) Co., Ltd., Shanghai (CN)

(72) Inventors: Zhibiao Liang, Shanghai (CN); Lihua Wang, Shanghai (CN); Xiaohong Zhou, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 116 days.

(21) Appl. No.: 14/298,980

(22) Filed: Jun. 9, 2014

(65) Prior Publication Data

US 2015/0301752 A1 Oct. 22, 2015

(30) Foreign Application Priority Data

Apr. 16, 2014 (CN) .......................... 2014 1 0153157

(51) Int. Cl.
*G06F 11/00* (2006.01)
*G06F 3/06* (2006.01)

(52) U.S. Cl.
CPC .............. *G06F 3/0613* (2013.01); *G06F 3/064* (2013.01); *G06F 3/0679* (2013.01)

(58) Field of Classification Search
None
See application file for complete search history.

(56) References Cited

U.S. PATENT DOCUMENTS

| 6,529,402 B1* | 3/2003 | Andersen | G11C 5/025 365/154 |
| 2006/0250944 A1* | 11/2006 | Hong | H04L 27/2602 370/210 |
| 2008/0294968 A1* | 11/2008 | Djordjevic | H03M 13/1111 714/801 |
| 2009/0307540 A1* | 12/2009 | Razazian | H04B 3/143 714/701 |
| 2009/0307541 A1* | 12/2009 | Razazian | H03M 13/2707 714/701 |
| 2010/0083072 A1* | 4/2010 | Prasad | H03M 13/271 714/762 |
| 2010/0146229 A1* | 6/2010 | Yang | G06F 12/0207 711/157 |
| 2010/0296603 A1* | 11/2010 | Lee | H04L 1/0071 375/295 |
| 2012/0094664 A1* | 4/2012 | Jung | H04W 48/16 455/434 |
| 2012/0198307 A1* | 8/2012 | Kibe | H03M 13/11 714/758 |
| 2013/0073920 A1* | 3/2013 | Nie | H03M 13/27 714/752 |
| 2015/0156242 A1* | 6/2015 | Hwang | H04L 65/607 375/260 |
| 2015/0163083 A1* | 6/2015 | Hwang | H04L 27/2627 375/260 |
| 2015/0229441 A1* | 8/2015 | Jiang | H04L 27/26 375/295 |

OTHER PUBLICATIONS

John L. Ramsey, Realization of Optimum Interleavers, IEEE Transactions on Information Theory, vol. IT-16, No. 3, May 1970, pp. 338-pp. 345.
G. David Forney, Jr., Burst-Correcting Codes for the Classic Bursty Channel, IEEE Transactions on Communications Technology, vol. COM-19, No. 5, Oct. 1971, pp. 772-pp. 781.
Hyeong-Ju Kang, and Byung-Do Yang, Low-Power Time Deinterleaver for ISDB-T Receiver, IEEE Transactions on circuits and system vol. 59 No. 10, Oct. 2012, pp. 668-672.

* cited by examiner

*Primary Examiner* — Daniel McMahon
(74) *Attorney, Agent, or Firm* — Perkins Coie LLP (57) ABSTRACT

A method of interleaving comprising: generating a combined data by combining, a plurality of columns of input data to be inputted to a plurality of adjacent sub-interleavers into a column, wherein data within same rows among the plurality of columns of input data have same delay time; writing the combined data row by row into an off-chip memory; delaying the combined data, by the off-chip memory; and splitting data outputted by the off-chip memory into the plurality of columns such that each split column includes data corresponding to one of the plurality of adjacent sub-interleavers.

20 Claims, 8 Drawing Sheets

FIG.8

METHOD OF INTERLEAVING, DE-INTERLEAVING, AND CORRESPONDING INTERLEAVER AND DE-INTERLEAVER

CLAIM PRIORITY

This application claims priority to Chinese application No. 201410153157.8 entitled "Method of interleaving, de-interleaving, and corresponding interleaver and de-interleaver", filed on Apr. 16, 2014 by Montage Technology (shanghai) Co., Ltd., which is incorporated herein by reference.

TECHNICAL FIELD

The present invention relates to signal processing, and more particularly, but not limited to a method of interleaving and de-interleaving, and corresponding interleaver and de-interleaver.

BACKGROUND

Traditionally, the data needed to be processed by an interleaver and a de-interleaver can be buffered in a Synchronous Dynamic random access memory (SDRM). Usually, the bit width of SDRM is 16 bit. If the data to be transferred is not integral multiple of 16 bits, the storage resources of SDRM obviously will be wasted. Therefore, an interleaver and a corresponding de-interleaver are expected to be invented to improve the throughput and utilization rate of SDRM.

SUMMARY

According to an embodiment of the present invention, A method of interleaving comprising: generating a combined data by combining, a plurality of columns of input data to be inputted to a plurality of adjacent sub-interleavers into a column, wherein data within same rows among the plurality of columns of input data have same delay time; writing the combined data row by row into an off-chip memory; delaying the combined data by the off-chip memory; and splitting data outputted by the off-chip memory into the plurality of columns such that each split column includes data corresponding to one of the plurality of adjacent sub-interleavers.

In another embodiment, a method of de-interleaving comprising generating a combined data by combining, a plurality of columns of input data to be inputted to a plurality of adjacent sub-deinterleavers into a column, wherein data within same rows among the plurality of columns of input data have same delay time; writing the combined data row by row into an off-chip memory; delaying the combined data by the off-chip memory; and splitting data outputted by the off-chip memory into the plurality of columns such that each split column includes data corresponding to one of the plurality of adjacent sub-deinterleavers.

In another embodiment, a first device comprising: a matrix interleaver, configured to generate a combined data by combining, a plurality of columns of input data to be inputted to a plurality of adjacent sub-interleavers into a column, wherein data within same rows among the plurality of columns of input data have same delay time; the matrix interleaver is further configured to write the combined data row by row into an off-chip memory; the off-chip memory is configured to delay the combined data by the off-chip memory; and a matrix deinterleaver, configured to split data outputted by the off-chip memory into the plurality of columns such that each split column includes data corresponding to one of the plurality of adjacent sub-interleavers.

In another embodiment, a second device comprising: a matrix interleaver, configured to generate a combined data by combining, a plurality of columns of input data to be inputted to a plurality of adjacent sub-deinterleavers into a column, wherein data within same rows among the plurality of columns of input data have same delay time; the matrix interleaver is further configured to write the combined data row by row into an off-chip memory; the off-chip memory is configured to delay the combined data by the off-chip memory; and a matrix deinterleaver, configured to split data outputted by the off-chip memory into the plurality of columns such that each split column includes data corresponding to one of the plurality of adjacent sub-deinterleavers.

DESCRIPTION OF THE DRAWINGS

The present invention is illustrated in an exemplary manner by the accompanying drawings. The drawings should be understood as exemplary rather than limiting, as the scope of the invention is defined by the claims. In drawings, the identical reference signs represent the same elements.

DETAILED DESCRIPTION

Note that any and all of the embodiments described above can be combined with each other, except to the extent that it may be stated otherwise above or to the extent that any such embodiments might be mutually exclusive in function and/or structure.

Figure 1:
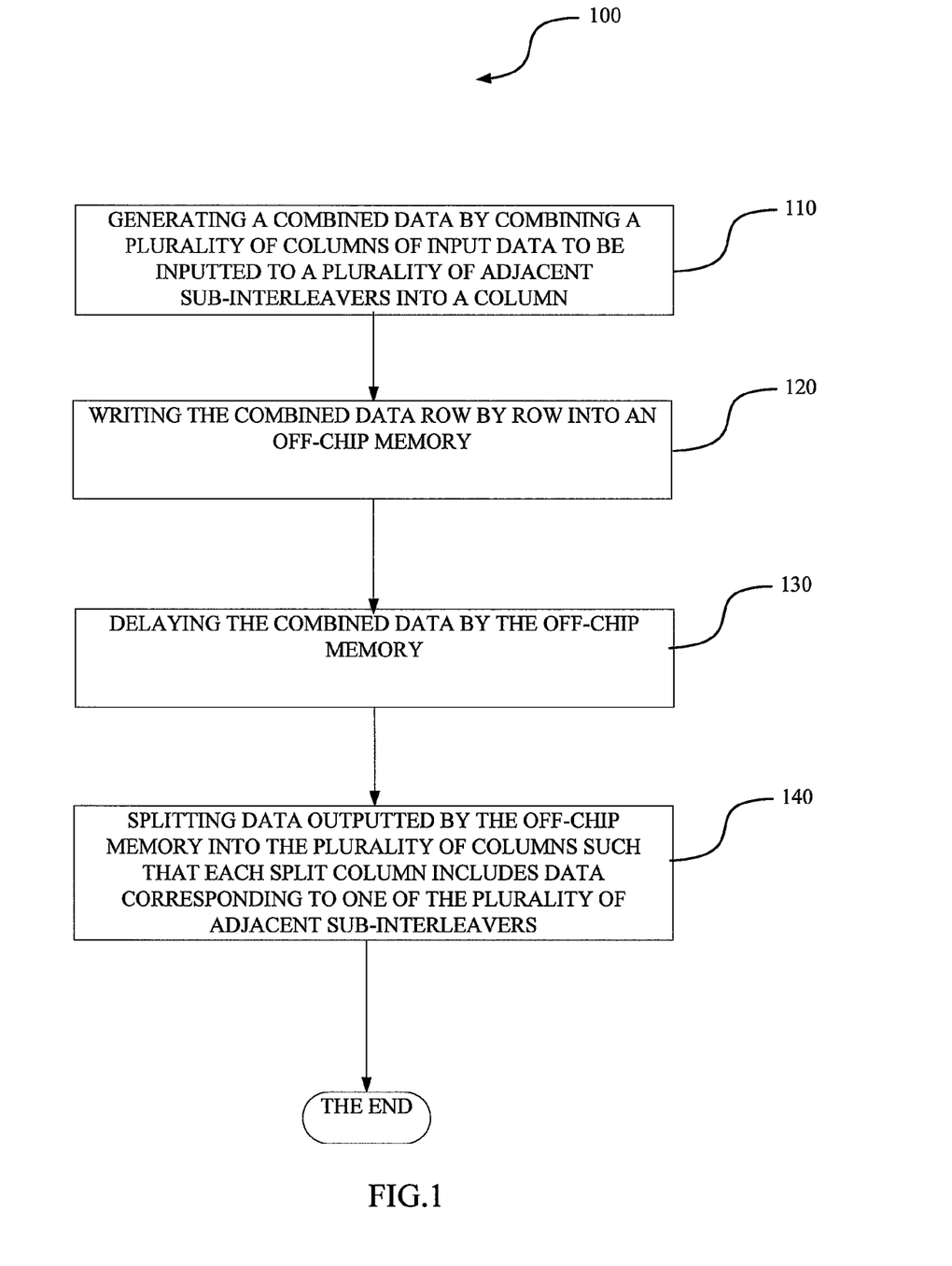
FIG. 1 is a flow chart illustrating an embodiment of a method of interleaving.

FIG. 1 is a flow chart illustrating an embodiment of a method 100 of interleaving. The method 100 of interleaving comprises generating (block 110) a combined data by combining a plurality of columns of input data to be inputted to a plurality of adjacent sub-interleavers into a column, wherein data within same rows among the plurality of columns of input data have same delay time; writing (block 120) the combined data row by row into an off-chip memory; delaying (block 130) the combined data by the off-chip memory; and splitting (block 140) data outputted by the off-chip memory into the plurality of columns such that each split column includes data corresponding to one of the plurality of adjacent sub-interleaver. FIG. 1 will be specifically described combined with FIG. 2 below.

Figure 2:
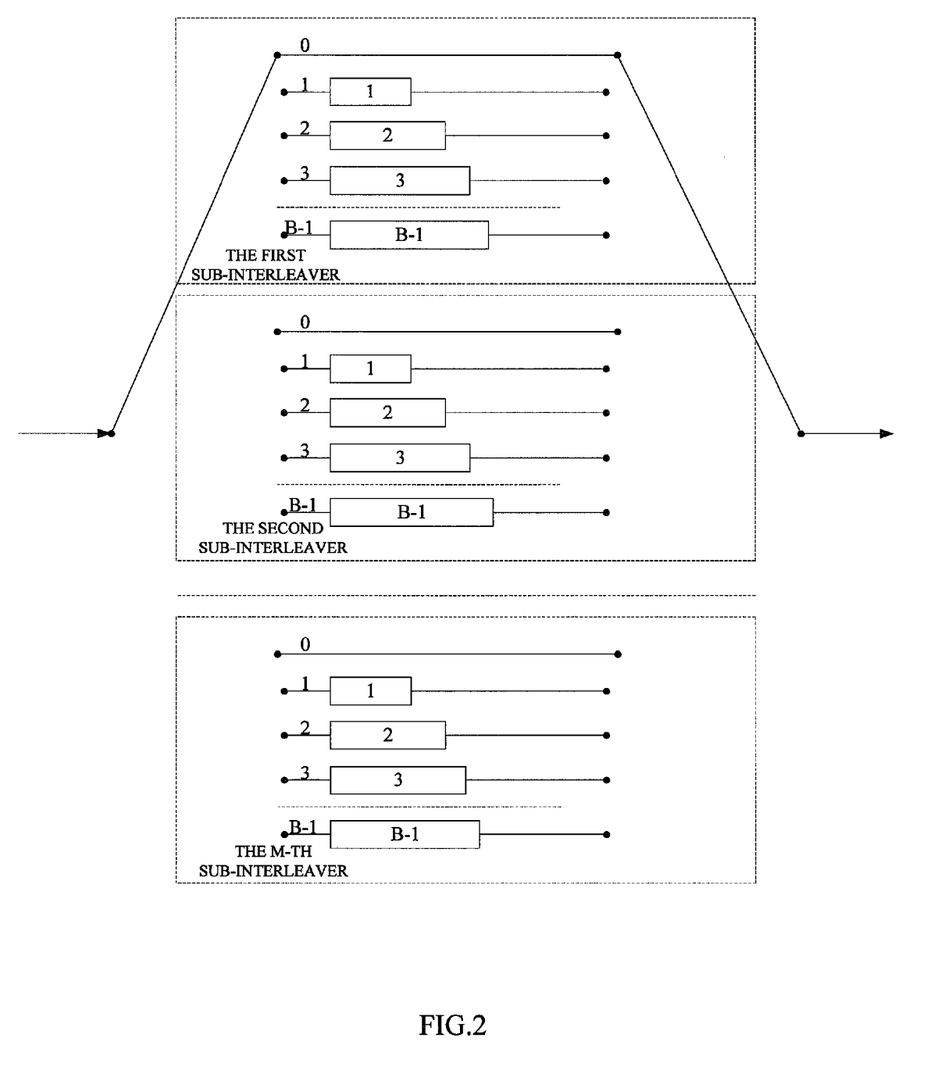
FIG. 2 is a diagram illustrating a plurality of sub-interleavers.

FIG. 2 is a diagram illustrating a plurality of sub-interleavers. In FIG. 2, B represents the width of the interleaving, i.e., the number of branches of the interleaver, wherein each sub-interleaver has B branches which range from 0~B−1. The input data of the input port of the interleaver wait to be inputted into the first column of the first sub-interleaver, the first column of the second sub-interleaver, the first column of the M-th interleaver in sequence. As shown in FIG. 2, No. 0 branch is delay-free, No. 1 branch has one symbol period delay, No. 2 branch has two symbol periods delay . . . No. B−1 branch has B−1 symbol periods delay. That is, No. 0 branches of the first, the second, . . . the M-th sub-interleavers are delay-free, No. 1 branches of the first, the second, . . . the M-th sub-interleavers have one symbol period delay . . . . Therefore, the respective numbered branch of each sub-interleavers has same delay time, i.e., the data within same row among each branch have the same delay time. In addition, different row within same column among each sub-branch has different delay times.

In each sub-interleaver shown in FIG. 2, the delay increases progressively from No. 0 branch to No. B−1 branch. Those skilled in the art can understand that the delay time of different branches among each sub-interleaver can also vary in other orders, e.g., in an order of descending progressively, or in a random order, as long as the same branches of different sub-interleavers have the same delay time.

If two sub-interleavers constitute a combination, the adjacent first and second sub-interleavers constitute a combination, the adjacent third and fourth sub-interleavers constitute a combination, and the like. If four sub-interleavers constitute a combination, the adjacent first, second, third and fourth sub-interleavers constitute a combination, the adjacent fifth, sixth, seventh and eighth sub-interleavers constitute a combination, and the like. Note that the source data are not actually inputted to each sub-interleaver to be interleaved, instead they are read into on-chip memory for subsequent processing.

Figure 3:
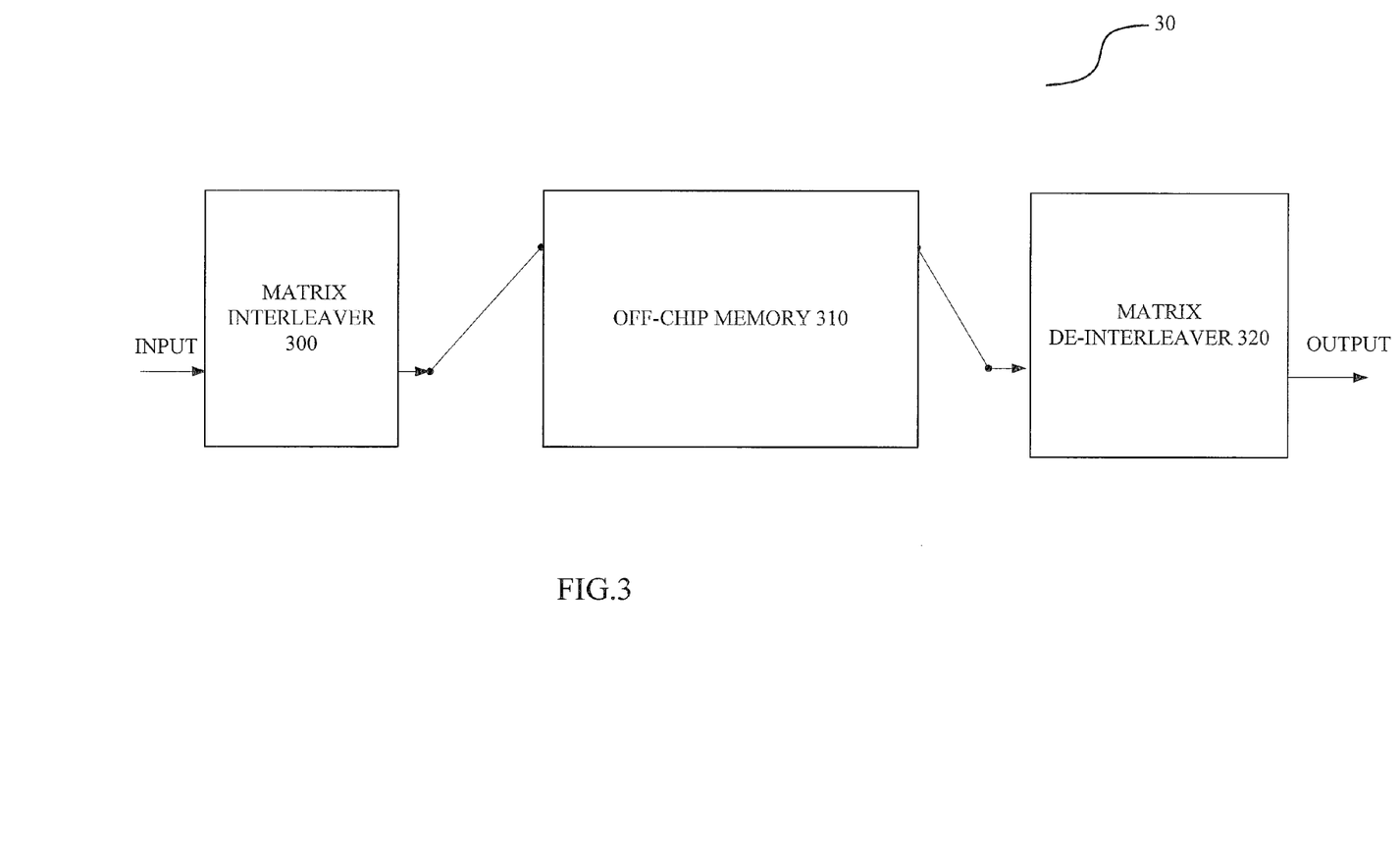
FIG. 3 is a block diagram illustrating an embodiment of an interleaver.

FIG. 3 is a block diagram illustrating an embodiment of an interleaver 300. The interleaver 30 comprises a matrix interleaver 300, an off-chip memory 310 and a matrix de-interleaver 320. The matrix interleaver 300 generates a combined data by combining a plurality of columns of input data to be inputted to a plurality of adjacent sub-interleavers into a column, wherein data within same rows among the plurality of columns of input data have same delay time. The matrix interleaver is further configured to write the combined data row by row into an off-chip memory. The off-chip memory 310 delays the combined data. The matrix de-interleaver 320 splits data outputted by the off-chip memory into the plurality of columns such that each split column includes data corresponding to one of the plurality of adjacent sub-interleaver. In FIG. 3, the matrix interleaver 300 and the matrix de-interleaver 320 are in the on-chip memory. In addition, the matrix interleaver 300, the off-chip memory 310 and the matrix de-interleaver 320 can be in the transmitting end of a transceiver.

Figure 4:
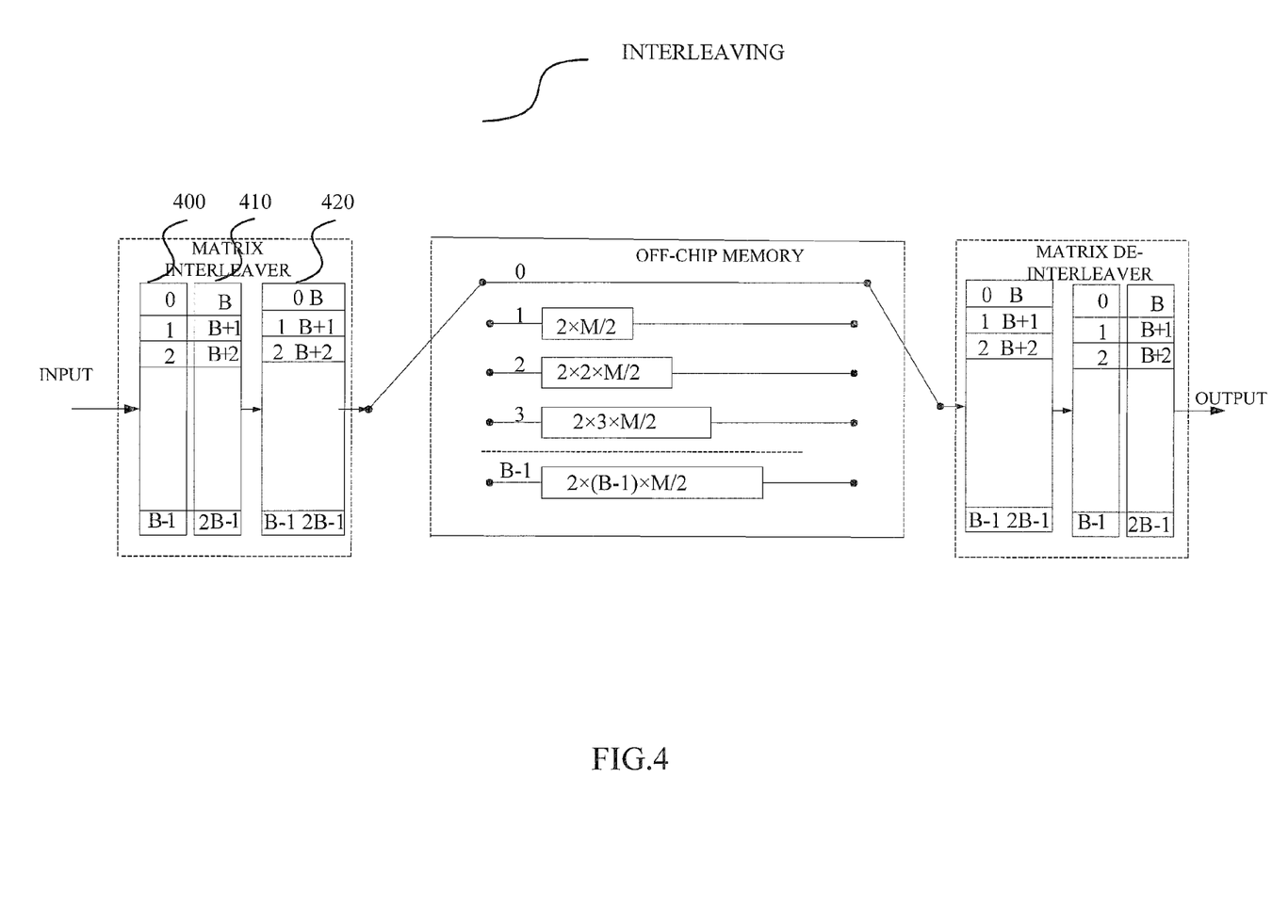
FIG. 4 is a block diagram illustrating an implementation of the interleaver as showed in FIG. 3.

FIG. 4 is a block diagram illustrating an implementation of the interleaver shown in FIG. 3. Hereinafter, combined with FIG. 4 as well as referring to FIG. 1 and FIG. 3, the interleaving method 100 in FIG. 1 is further described. In FIG. 4, the combination having two adjacent sub-interleavers is described. Those skilled in the art can understand that the number of the plurality of adjacent sub-interleavers in the combination operation are not limited to two, those skilled in the art can adjust the number according to practical application, which is described hereinafter. Referring to FIG. 4, symbols 0, 1, 2, . . . B−1 represent the first column of data 400 to be inputted to the first sub-interleaver, symbols B, B+1, B+2, . . . 2B−1 represent the first column of data 410 to be inputted to the second sub-interleaver, i.e., correspond to symbols 0, 1, 2, . . . B−1 in the second sub-interleaver as shown in FIG. 2. In FIG. 4, in order to distinguish from the first column of data 400 to be inputted to the first sub-interleaver, the first column of data 410 to be inputted to the second sub-interleaver are renamed to B, B+1, B+2, . . . 2B−1. As shown in FIG. 4, the column data 400 to be inputted to the first sub-interleaver and the column data 410 to be inputted to the second sub-interleaver are combined into one column 420 which is represented as a combined data 420. Wherein No. 0 branch is in the first row of the first sub-interleaver while No. B branch is in the first row of the second sub-interleaver, therefore the data in No. 0 branch has the same delay time as the data in No. B branch. As shown in FIG. 4, the data in No. 0 branch and in No. B branch are in the same row of the combined data 420. Similarly, No. 1 branch and No. B+1 branch are in the same row, i.e., the data in No. 1 branch have the same delay time as the data in No. B+1 branch, and the like. Though not shown in FIG. 4, similarly, the data of the adjacent third and the fourth sub-interleavers are combined, the data of the adjacent fifth and the sixth sub-interleavers are combined, and the like. Then the combined data are written into an off-chip memory row by row, the "row" herein means the combined row, i.e., the unit comprising [0, B] is inputted to No. 0 branch of the off-chip memory, the unit comprising [1, B+1] is inputted to No. 1 branch of the off-chip memory, . . . the B-th row of the combined data comprising [B−1, 2B−1] is inputted to No. B−1 branch of the off-chip memory.

Delaying (block 130) the combined data by the off-chip memory can be achieved by the off-chip memory as shown in FIG. 4 as well as the one like the off-chip memory comprising M sub-interleavers as shown in FIG. 2. Those skilled in the art can understand that the number M of the sub-interleavers can be irrelevant with the number of sub-interleavers corresponding to the combined column number by the matrix interleaver, i.e., M may not equal two. As shown in FIG. 4, the first row of the combined data 420 are inputted to No. 0 branch of the off-chip memory, the data in this row are straight through without any delay; the second row of the combined data 420 are inputted to No. 1 branch of off-chip memory and are delayed one symbol period by No. 1 branch of the off-chip memory; the third row of the combined data 420 are inputted to No. 2 branch of the off-chip memory and are delayed two symbol periods by No. 2 branch of the off-chip memory, . . . the B-th row of the combined data 420 are inputted to No. B−1 branch of the off-chip memory and are delayed B−1 symbol periods by No. B−1 branch of the off-chip memory.

After that, when outputted, the data outputted by the off-chip memory are split (block 140) into a plurality of columns, such that each split column includes the data corresponding to one of the plurality of adjacent sub-interleavers. As shown in FIG. 4, the combined data are split into two columns, which correspond to the column data 0, 1, . . . B−1 corresponding to the first sub-interleaver and the column data B, B+1, B+2, . . . 2B−1 corresponding to the second sub-interleaver respectively.

More generally, M in FIG. 4 is even, the matrix interleavers has a size of B*2. The data of two columns such as I (b, 2m) and I (b, 2m+1) (b ranges from 0 to B−1, and m ranges from 0 to M/2−1) are inputted into the matrix interleaver first, and the interleaver converts these two columns into one when the data are outputted. Each unit in this column (i.e., unit [I (b, 2m), (b, 2m+1)], b ranges from 0 to B−1) inputted to the off-chip memory basically occupies the contiguous or the same address on the off-chip memory. This unit is split into the data of two columns again through the matrix de-interleaver when the unit is outputted.

In other words, the foregoing interleaver and de-interleaver have an important feature, i.e., the data of the interleaved unit in the same row has the same delay time. Therefore, firstly, the entire interleaver can be split into (M/k) sub-interleavers, where $k=2^n$ and k is a factor of M. Secondly, the data having the same delay time in k columns are combined by the matrix interleaver. Thus the throughput rate of external memory is increased through the continuous reading and writing from and to external memory. In addition, when the bit width of data needed to be transmitted is not a multiple of 16 bit, the utilization rate of external memory can be increased effectively.

Figure 5:
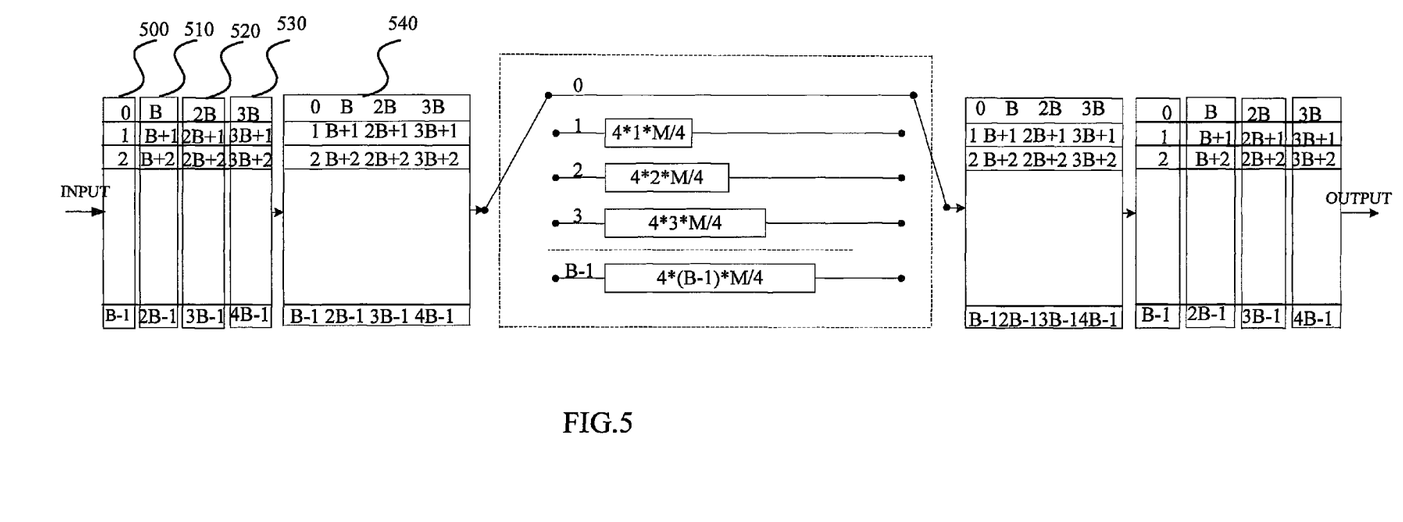
FIG. 5 is a block diagram illustrating another implementation of the interleaver as showed in FIG. 3.

FIG. 5 is a block diagram illustrating another implementation of the interleaver as shown in FIG. 3. Referring to FIG. 5, symbols 0, 1, 2, . . . B−1 represent the data of first column 500 to be inputted to the first sub-interleaver, symbols B, B+1, B+2, . . . 2B−1 represent the data of first column 510 to be inputted to the second sub-interleaver, i.e., correspond to symbols 0, 1, 2, . . . B−1 in the second sub-interleaver as shown in FIG. 2. In FIG. 5, in order to distinguish from the data of first column 500 to be inputted to the first sub-interleaver, the first column of data 510 to be inputted to the second sub-interleaver are represented as B, B+1, B+2, . . . 2B−1. Similarly, symbols 2B, 2B+1, 2B+2, . . . 3B−1 represent the first column of data 520 to be inputted to the third sub-interleaver, i.e., correspond to symbols 0, 1, 2, . . . B−1 in the third sub-interleaver as shown in FIG. 2. Symbols 3B, 3B+1, 3B+2, . . . 4B−1 represent the first column of data 530 to be inputted to the fourth sub-interleaver, i.e., correspond to symbols 0, 1, 2, . . . B−1 in the fourth sub-interleaver as shown in FIG. 2. As shown in FIG. 5, the first columns of data 500, 510, 520, 530 to be inputted to the first sub-interleaver, the second sub-interleaver, the third sub-interleaver, the fourth sub-interleaver respectively are combined into one column 540 which is represented as a combined data 540. Additionally, No. 0 branch is in the first row of the first sub-interleaver, No. B branch is in the first row of the second sub-interleaver, No. 2B branch is in the first row of the third sub-interleaver, and No. 3B branch is in the first row of the fourth sub-interleaver. Therefore the data in No. 0 branch, No. B branch, No. 2B branch, NO. 3B branch have the same delay time. As shown in FIG. 5, the data in No. 0 branch, NO. B branch, No. 2B branch, and No. 3B branch are in the same row of the combined data 540. Similarly, No. 1 branch, No. B+1 branch, No. 2B+1 branch and No. 3B+1 branch are in the same row, i.e., the data in No. 1 branch, No. B+1 branch, No. 2B+1 branch, and No. 3B+1 branch have the same delay time, and the like. Though not shown in FIG. 5, the data of adjacent fifth, sixth, seventh and eighth sub-interleavers can be combined together, the data of the adjacent ninth, tenth, eleventh and twelfth sub-interleavers can be combined together, and the like. Then the combined data are written into an off-chip memory row by row, the "row" herein means the combined row, i.e., the unit comprising [0, B, 2B, 3B] is inputted to No. 0 branch of the off-chip memory, the unit comprising [1, B+1, 2B+1, 3B+1] is inputted to No. 1 branch of the off-chip memory, . . . the B-th row of the combined data comprising [B−1, 2B−1, 3B−1, 4B−1] is inputted to No. B−1 branch of the off-chip memory.

Delaying (block 130) the combined data by the off-chip memory can be achieved by the off-chip memory as shown in FIG. 5 as well as one like the off-chip memory comprising M sub-interleavers as shown in FIG. 2. As shown in FIG. 5, the first row of the combined data 540 are inputted to No. 0 branch of the off-chip memory, the data in this row are straight through without any delay; the second row of the combined data 540 are inputted to No. 1 branch of the off-chip memory and are delayed one symbol period by No. 1 branch of the off-chip memory; the third row of the combined data 540 are inputted to No. 2 branch of the off-chip memory and are delayed two symbol periods by No. 2 branch of the off-chip memory, . . . the B-th row of the combined data 540 are inputted to No. B−1 branch of the off-chip memory and are delayed B−1 symbol periods by No. B−1 branch of the off-chip memory. Since the data of the adjacent first, second, third and fourth sub-interleavers are combined together, memory space of the off-chip memory is saved.

After that, when outputted, the data outputted by the off-chip memory are split (block 140) into a plurality of columns, such that each split column includes data corresponding to one of the plurality of adjacent sub-interleavers. As shown in FIG. 5, the combined data are split into four columns, which correspond to the column of data 0, 1, . . . B−1 corresponding to the first sub-interleaver, the column of data B, B+1, B+2, . . . 2B−1 corresponding to the second sub-interleaver, the column of data 2B, 2B+1, 2B+2, . . . 3B−1 corresponding to the third sub-interleaver, the column of data 3B, 3B+1, 3B+2, . . . 4B−1 corresponding to the fourth sub-interleaver respectively.

The structures shown in FIG. 4 and FIG. 5 are applicable to the data to be transferred having a bit width which is not integer multiple of 16 bits, the columns of input data of several adjacent sub-interleavers can be combined together orderly, as shown in FIG. 4 or FIG. 5, by using the matrix interleaver, then writing them continuously to the off-chip memory. When outputted, the data are read from the off-chip memory continuously, then the data are split into subsequent processing modules by using corresponding matrix de-interleavers. Since the addresses of the combined data are continuous, the storage feature of the off-chip memory is utilized effectively, which increases the throughput rate and utilization rate and decreases the memory power consumption.

Figure 6:
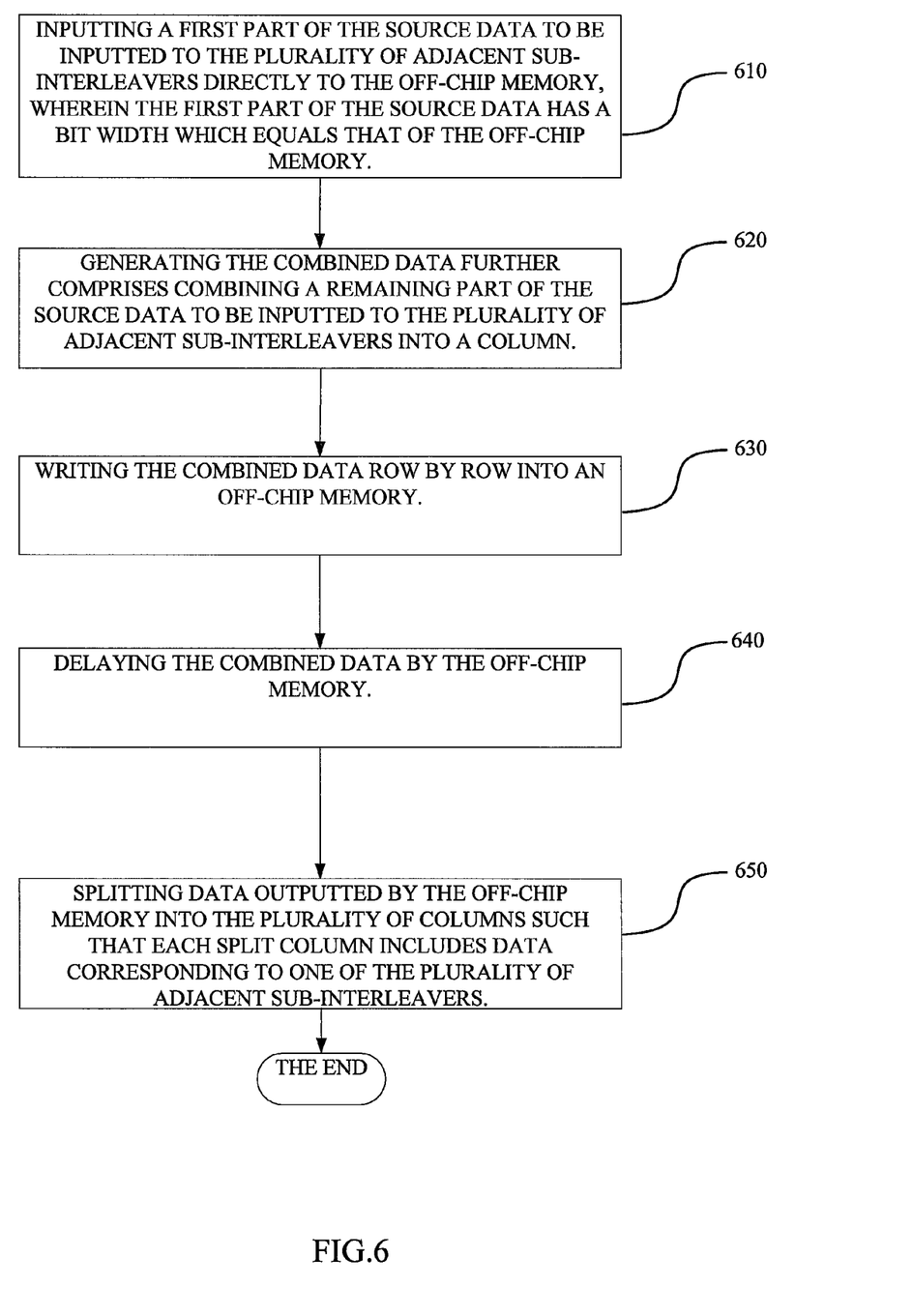
FIG. 6 is a flow chart illustrating another embodiment of a method of interleaving.

FIG. 6 is a flow chart illustrating another embodiment of a method 60 of interleaving. In this embodiment, the source data has a bit width larger than the bit width of the off-chip memory, therefore the source data can be split. For example, the bit width of the source data is 24 bits which is larger than the 16 bits bit width of the off-chip memory. In this method, first inputting (block 610) a first part of the source data to be inputted to the plurality of adjacent sub-interleavers directly to the off-chip memory, wherein the first part of the source data has a bit width which equals that of the off-chip memory, i.e., the bit width of the first part of the source data is 16 bits. Then, generating the combined data further comprises combining (block 620) a remaining part of the source data to be inputted to the plurality of adjacent sub-interleavers into a column, wherein the remaining part includes the remaining bit width of the source data except the first part, i.e., the remaining part includes the remaining bit width except 16 bits, which is the remaining 8 bits. Blocks 630, 640 and 650 are similar to blocks 120, 130, 140 in FIG. 1 respectively, which are not reiterated herein. In the embodiment shown in FIG. 6, the input data having a bit width larger than that of the off-chip memory are divided into two parts, the first part having a bit width which equals that of the off-chip memory is directly inputted to the off-chip memory and then interleaved by the off-chip memory, while the remaining part that exceeds the bit width of the off-chip memory and the remaining part of the adjacent sub-interleaver which also exceeds the bit width of the off-chip memory are combined together to be stored in the off-chip memory and then interleaved, therefore the memory space of the off-chip memory is saved.

Alternatively, before generating (block 620) the combined data, the method 600 further comprises storing the remaining part of the source data in an on-chip memory.

Alternatively, still referring to FIG. 4 and FIG. 5 combined with FIG. 6, in FIG. 4 two adjacent column data are combined, in FIG. 5 four adjacent column data are combined. Therefore, the number of columns combined or the adjacent sub-interleavers combined is based on both a bit width of the off-chip memory and a bit width of the remaining part.

In the foregoing description, the on-chip memory comprises but is not limited to a Static Random Access Memory (SRAM); the off-chip memory comprises but is not limited to Synchronous Dynamic random access memory (SDRAM).

At least one of the embodiments utilizes the external memory effectively, like the storage feature of SDRAM, and the throughput rate is increased while the memory power consumption is decreased. Additionally, if the bit width of the data to be transferred is not integer multiple of 16 bits, conventional solution will cause an obvious waste for the memory space of off-chip SDRAM. However, at least one of the embodiments in the present invention can write the $2^n$ columns of combined data to be interleaved to the SDRAM and split them at the output end, thus the resources can be utilized effectively.

Figure 7:
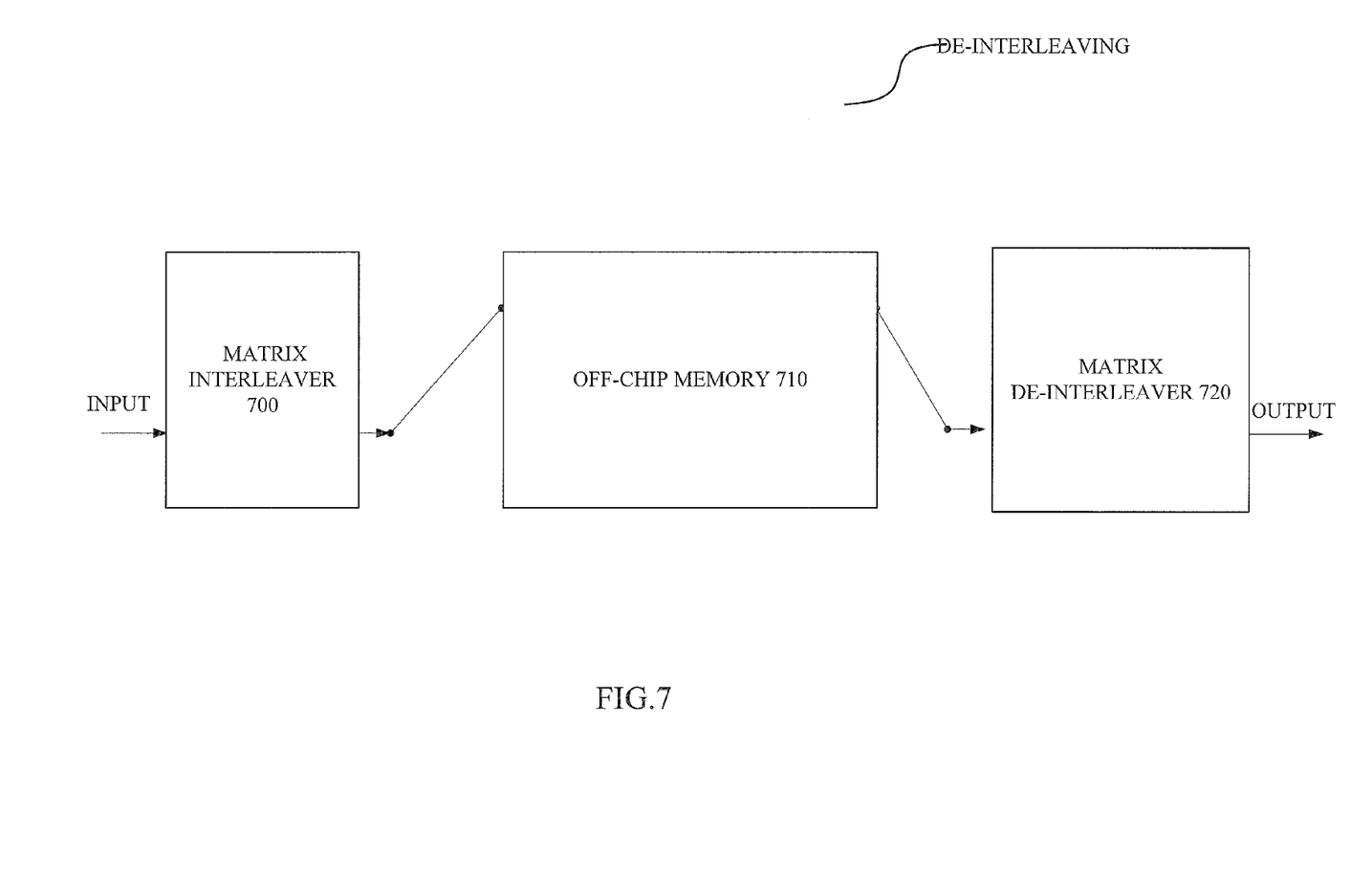
FIG. 7 is a block diagram illustrating an embodiment of a de-interleaver.
Figure 8:
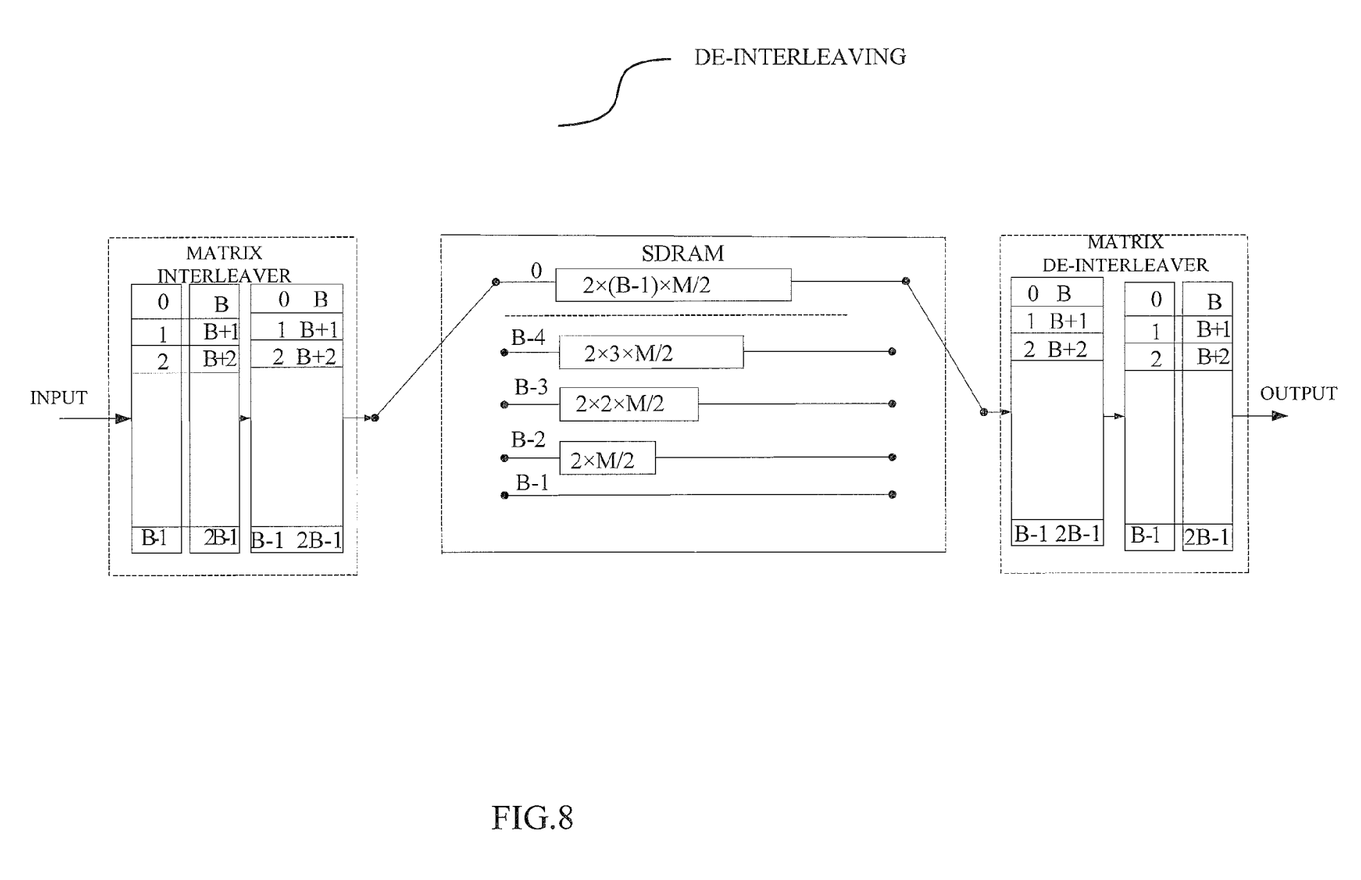
FIG. 8 is a block diagram illustrating the details of the de-interleaver as showed in FIG. 7.

FIG. 7 is a block diagram illustrating an embodiment of a de-interleaver. FIG. 8 is a block diagram illustrating the details of the de-interleaver as shown in FIG. 7. In FIG. 7, a matrix interleaver 700 and a matrix de-interleaver 720 are in the on-chip memory. Additionally, the matrix interleaver 700, an off-chip memory 710 and the matrix de-interleaver 720 all can be in the receiving end of the transceiver. The embodiment of the de-interleaver shown in FIG. 7 is similar to the embodiment of interleaver described in FIG. 3, the distinction is the input data in FIG. 7 are the data to be inputted to the sub-deinterleaver while the input data in FIG. 3 are the data to be inputted to the sub-interleaver. As the structure of FIG. 7 is similar to FIG. 3, the details of FIG. 7 are not reiterated herein. Similarly, the distinction between FIG. 4 and FIG. 8 is the input data in FIG. 8 are the data to be inputted to the sub-deinterleaver while the input data in FIG. 4 are the data to be inputted to the sub-interleaver. As the structure of FIG. 8 is similar to FIG. 4, the details of FIG. 8 are also not reiterated herein.

Although the present invention has been described with reference to specific exemplary embodiments, the present invention is not limited to the embodiments described herein, and it can be implemented in form of modifications or alterations without deviating from the spirit and scope of the appended claims. Accordingly, the description and the drawings are to be regarded in an illustrative rather than a restrictive sense.

From the foregoing, it will be appreciated that specific embodiments of the technology have been described herein for purposes of illustration, however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. A method of interleaving comprising:
generating a combined data by combining, a plurality of columns of input data to be inputted to a plurality of adjacent sub-interleavers into one column, wherein data within same rows among the plurality of columns of input data have same delay time;
writing the combined data row by row into an off-chip memory;
delaying, the combined data, by the off-chip memory; and
splitting data outputted by the off-chip memory into a plurality of split columns such that each split column includes data corresponding to one of the plurality of adjacent sub-interleavers, wherein a column count of the plurality of columns of input data is the same as a column count of the plurality of split columns.

2. The method of claim 1,
wherein combining, the plurality of columns of input data to be inputted to the plurality of adjacent sub-interleavers into the one column is implemented by a matrix interleaver.

3. The method of claim 1,
wherein the off-chip memory comprises multiple sub-interleavers, and delaying, the combined data, by the off-chip memory is implemented by the multiple sub-interleavers.

4. The method of claim 1,
wherein splitting the data outputted by the off-chip memory into the plurality of split columns is implemented by a matrix de-interleaver.

5. The method of claim 1, wherein source data has a bit width larger than the bit width of the off-chip memory, and the method further comprises the following before generating the combined data:
storing a first part of the source data to be inputted to the plurality of adjacent sub-interleavers directly to the off-chip memory, wherein the first part of the source data has a bit width which equals that of the off-chip memory;
generating the combined data further comprises combining a remaining part of the source data to be inputted to the plurality of adjacent sub-interleavers into the one column, the remaining part including the remaining bit width of the source data except the first part.

6. The method of claim 5, further comprising the follow before generating the combined data:
storing a remaining part of the source data in an on-chip memory.

7. The method of claim 5, wherein the column count of the plurality of columns of input data is based on both a bit width of the off-chip memory and a bit width of the remaining part.

8. The method of claim 5, wherein the on-chip memory comprises a static random-access memory (SRAM).

9. The method of claim 1, wherein the off-chip memory comprises Synchronous Dynamic random access memory (SDRAM).

10. A method of de-interleaving comprising
generating a combined data by combining, a plurality of columns of input data to be inputted to a plurality of adjacent sub-deinterleavers into one column, wherein data within same rows among the plurality of columns of input data have same delay time;
writing the combined data row by row into an off-chip memory;

delaying, the combined data, by the off-chip memory; and splitting data outputted by the off-chip memory into a plurality of split columns such that each split column includes data corresponding to one of the plurality of adjacent sub-deinterleavers, wherein a column count of the plurality of columns of input data is the same as a column count of the plurality of split columns.

11. The method of claim 10, wherein combining, the plurality of columns of input data to be inputted to the plurality of adjacent sub-deinterleavers into the one column is implemented by a matrix interleaver.

12. The method of claim 10, wherein the off-chip memory comprises multiple sub-deinterleavers, and delaying, the combined data, by the off-chip memory is implemented by the multiple sub-deinterleavers.

13. The method of claim 10, wherein splitting data outputted by the off-chip memory into the plurality of split columns is implemented by a matrix de-interleaver.

14. The method of claim 10, wherein source data has a bit width larger than the bit width of the off-chip memory, and the method further comprises the following before generating the column data:

storing a first part of the source data to be inputted to the plurality of adjacent sub-deinterleavers sequentially and directly to the off-chip memory, wherein the first part of the source data has a bit width which equals that of the off-chip memory;

generating the column data further comprises combining a remaining part of the source data to be inputted to the plurality of adjacent sub-deinterleavers into the one column, the remaining part including the remaining bit width of the source data except the first part.

15. The method of claim 14, further comprising the follow before generating the column data storing a remaining part of the source data in an on-chip memory.

16. The method of claim 14 wherein the column count of the plurality of columns of input data is based on both a size of the off-chip memory and the bit width of the remaining part.

17. The method of claim 15, wherein the on-chip memory comprises a static random-access memory (SRAM).

18. The method of claim 10, wherein the off-chip memory comprises Synchronous Dynamic random access memory (SDRAM).

19. The method of claim 10, wherein delaying, the combined data, by the off-chip memory comprises inverse operation to an interleaver.

20. A first device comprising:

a matrix interleaver, configured to generate a combined data by combining, a plurality of columns of input data to be inputted to a plurality of adjacent sub-interleavers into a column, wherein data within same rows among the plurality of columns of input data have same delay time, the matrix interleaver is further configured to write the combined data row by row into an off-chip memory;

the off-chip memory is configured to delay the combined data; and a matrix deinterleaver, configured to split data outputted by the off-chip memory into a plurality of split columns such that each split column includes data corresponding to one of the plurality of adjacent sub-interleavers, wherein a column count of the plurality of columns of input data is the same as a column count of the plurality of split columns.

* * * * *